US008610605B2

(12) United States Patent
Froemmgen

(10) Patent No.: US 8,610,605 B2
(45) Date of Patent: Dec. 17, 2013

(54) METHOD AND SYSTEM FOR DATA COMPRESSION

(75) Inventor: Alexander Froemmgen, Darmstadt (DE)

(73) Assignee: SAP AG, Walldorf (DE)

(*) Notice: Subject to any disclaimer, the term of this patent is extended or adjusted under 35 U.S.C. 154(b) by 0 days.

(21) Appl. No.: 13/434,456

(22) Filed: Mar. 29, 2012

(65) Prior Publication Data

US 2012/0319876 A1  Dec. 20, 2012

Related U.S. Application Data

(60) Provisional application No. 61/498,421, filed on Jun. 17, 2011.

(51) Int. Cl.
*H03M 7/00* (2006.01)
(52) U.S. Cl.
USPC ............... 341/59; 341/57; 341/64; 341/69; 341/73; 341/75; 375/E7.227; 707/742; 707/E17.01; 711/217; 711/E12.002
(58) Field of Classification Search
USPC ............ 341/50–90; 375/E7.227; 707/742; 707/E17.01, E7.049; 711/217, E12.002
See application file for complete search history.

(56) References Cited

U.S. PATENT DOCUMENTS

| | | | |
|---|---|---|---|
| 5,572,209 A * | 11/1996 | Farmer et al. | 341/67 |
| 5,704,060 A | 12/1997 | Del Monte | |
| 6,507,846 B1 | 1/2003 | Consens | |
| 7,463,178 B2 * | 12/2008 | Moore | 341/155 |
| 7,467,155 B2 | 12/2008 | McCool et al. | |
| 2007/0016602 A1 | 1/2007 | McCool et al. | |
| 2007/0277264 A1 | 11/2007 | Nanto et al. | |
| 2012/0089621 A1 | 4/2012 | Liu et al. | |
| 2012/0323927 A1 | 12/2012 | Froemmgen | |

* cited by examiner

*Primary Examiner* — Lam T Mai
(74) *Attorney, Agent, or Firm* — Fountainhead Law Group PC

(57) ABSTRACT

In one aspect, methods and systems for variable-block length encoding of data, such as an inverted index for a file are disclosed. These methods and systems provide for relatively fast encoding and decoding, while also providing for compact storage. Other aspects include a nearly 1:1 inverted index comprising a position vector and a data store, wherein values that have a unique location mapping are represented directly in the position vector, while for 1:n values (n>1), the position vector can include a pointer, and potentially some portion of information that would typically be stored in the data area, in order to fully use fixed width portions of the position vector (where a maximum pointer size is smaller than a maximum location identifier size).

20 Claims, 9 Drawing Sheets

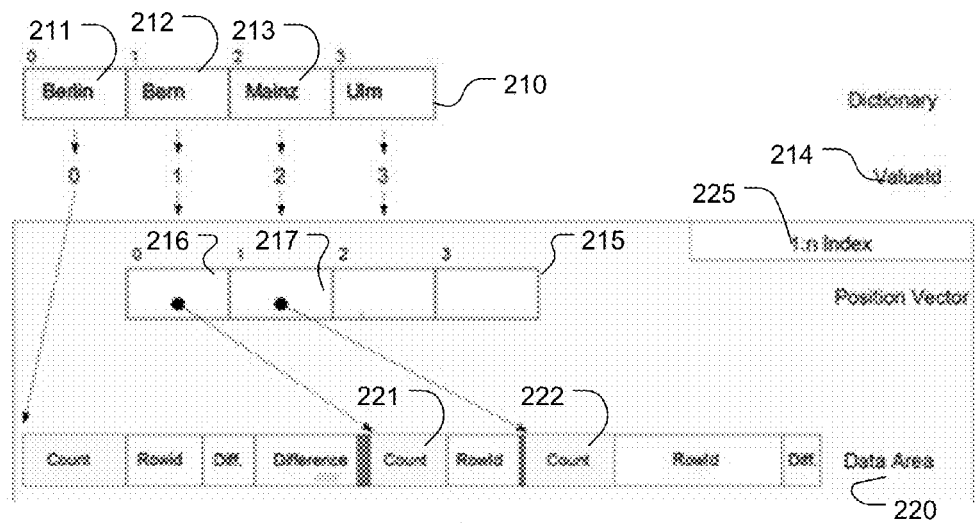
Fig. 2
Fig. 3
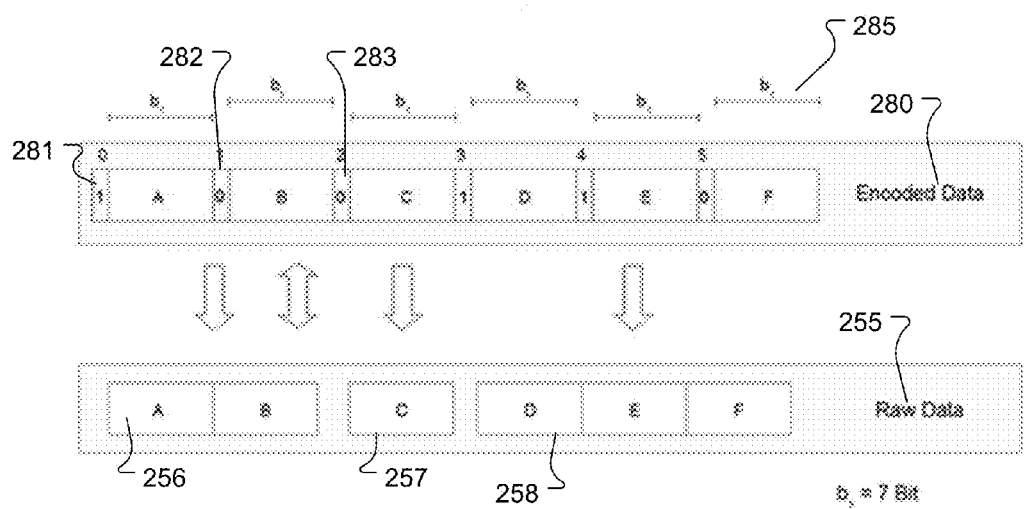

METHOD AND SYSTEM FOR DATA COMPRESSION

CROSS REFERENCE TO RELATED APPLICATIONS

This application claims priority to U.S. provisional app. No. 61/498,421, filed on Jun. 17, 2011, entitled "Computer-Implemented Method for Data Compression and Corresponding Computer System for Data Compression", which is incorporated by reference in its entirety, for all purposes, herein.

BACKGROUND

The present disclosure relates to data compression, and in a particular aspect, to a computer-implemented method for data compression and a corresponding computer system for executing the data compression method.

Unless otherwise indicated herein, the approaches described in this section are not prior art to the claims in this application and are not admitted to be prior art by inclusion in this section.

In computer science, an inverted index is an index data structure that stores a mapping from contents (such as words or numbers) in a file, to the locations of the contents in the file. The file may be a database file, a document, or a set of documents. An inverted index provides for fast search of text in a file with a cost for increased processing of the file at the time the file is added to a database. Inverted indices are relatively widely used data structures in document retrieval systems for large scale search, such as for searches performed by search engines.

There are two main types of inverted indexes. A first type of inverted index is a record level inverted index, which contains a list of references to documents for each word. A second type of inverted index is a word level inverted index (sometimes referred to simply as an "inverted list") and contains the position of each word within a document. The latter form provides additional functionality, such as phrase searching.

Inverted indexes can be compressed with compressions variously focused on relatively high compression, high compression speeds, high decompression speeds, etc. These various compression focuses often have tradeoffs. For example, a relatively high compression may provide for relatively low decompression speeds, and relatively high decompression speeds may be associated with relatively low compression.

SUMMARY

Embodiments improve computer-implemented methods for data compression. In one embodiment, the present invention includes a computerized method for variable-block length coding an inverted index for a file. In another embodiment, a computer system is configured for executing the method. Embodiment provide for relatively fast and relatively dense encoding, while also providing for relatively fast decoding and search.

In one aspect, a method of data compression is provided. The method comprises accessing a raw data set comprising a plurality of data elements, determining a set of block sizes to be used in forming an encoded data set providing a compressed representation of the plurality of data elements in the raw data set. The set of block sizes comprises differing block sizes.

The method includes determining a respective grouping of one or more blocks in which to store each data element of the raw data set. Each block in the grouping is of a block size selected from the set of block sizes. The method also includes storing the groupings in a sequence, in association with respective unary size codes indicative of a size of each grouping in the sequence. The data elements of the raw data set may include inverted index data. The unary codes may be stored in the sequence of block groupings, each unary code preceding the grouping to which it pertains.

The method of data compression operates on binary data. The determining of the set of block sizes can include determining at least one pair of block sizes of n bits and n+1 bits. The storing in that instance can include storing a data element of the raw data set having n+1 bits with a unary code indicating a block size of n+1 bits, with a data field of n bits by excluding the most significant bit of the raw data element having n+1 bits from storage in the block.

The method can be implemented on a machine configured by instructions obtained from a non-transitory medium.

BRIEF DESCRIPTION OF THE DRAWINGS

FIG. 2 depicts an example of a 1:n Index;

FIG. 3 depicts an approach to variable byte-length encoding;

DETAILED DESCRIPTION

Described herein are a computerized method for data compression and an associated computer system for data compression. One exemplary application of the disclosed data compression techniques relates to data compression for Information Retrieval (IR). Some disclosed aspects relate to data compression of inverted indices. However, such focus is for clarity and consistency, rather than by way of limitation as to application of the disclosed systems and methods. In the following description, for purposes of explanation, numerous examples and specific details are set forth in order to provide a thorough disclosure. However, the disclosure is merely exemplary of various aspects and embodiments within the scope of the appended claims. In particular, it will be evident, to one skilled in the art, in view of the present disclosure that features disclosed in one context or situation can in many cases be used in other contexts and implementations, and in various combinations and subcombinations. Usage of equivalents of the features and concepts described herein also would be apparent in view of this disclosure.

Figure 1:
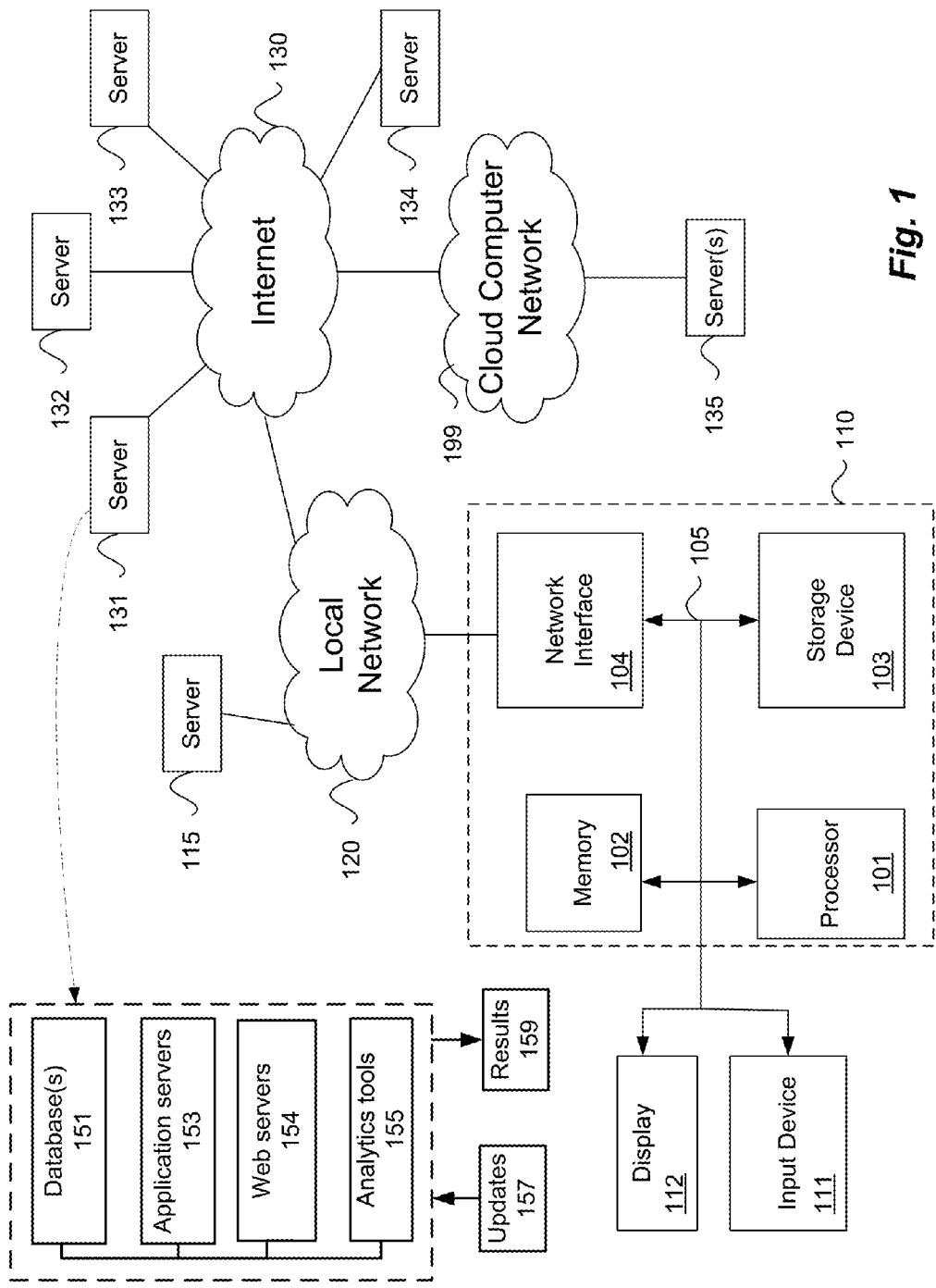
FIG. 1 depicts hardware of a machine configured with processes according to embodiments.

FIG. 1 illustrates an example context in which aspects of the disclosure can be implemented. FIG. 1 depicts hardware of a machine configured with processes according to embodiments. The computer systems and software servers on a local network may communicate with each other and other computer systems and servers running instances of programs on a cloud computer system. An example computer system 110 is illustrated in FIG. 1. Computer system 110 includes a bus 105 or other communication mechanism for communicating information, and a processor 101 coupled with bus 105 for processing information. Computer system 110 also includes a memory 102 coupled to bus 105 for storing information and instructions to be executed by processor 101, including information and instructions for performing the techniques described above, for example. This memory may also be used for storing variables or other intermediate information during execution of instructions to be executed by processor 101. Possible implementations of this memory may be, but are not limited to, random access memory (RAM), read only memory (ROM), or both. A storage device 103 is also provided for storing information and instructions. Common forms of storage devices include, for example, a hard drive, a magnetic disk, an optical disk, a CD-ROM, a DVD, a flash memory, a USB memory card, or any other medium from which a computer can read. Storage device 103 may include source code, binary code, or software files for performing the techniques above, for example. Storage device and memory are both examples of computer readable mediums.

Computer system 110 may be coupled via bus 105 to a display 112, such as a cathode ray tube (CRT) or liquid crystal display (LCD), for displaying information to a computer user. An input device 111 such as a keyboard and/or mouse is coupled to bus 105 for communicating information and command selections from the user to processor 101. The combination of these components allows the user to communicate with the system. In some systems, bus 105 may be divided into multiple specialized buses.

Computer system 110 also includes a network interface 104 coupled with bus 105. Network interface 104 may provide two-way data communication between computer system 110 and the local network 120. The network interface 104 may be a digital subscriber line (DSL) or a modem to provide data communication connection over a telephone line, for example. Another example of the network interface is a local area network (LAN) card to provide a data communication connection to a compatible LAN. Wireless links are another example. In any such implementation, network interface 104 sends and receives electrical, electromagnetic, or optical signals that carry digital data streams representing various types of information.

Computer system 110 can send and receive information, including messages or other interface actions, through the network interface 104 across a local network 120, an Intranet, or the Internet 130. For a local network, computer system 110 may communicate with a plurality of other computer machines, such as server 115 one or more of which may run backend system software such as an ERP software system, CRM, or database for example. Accordingly, computer system 110 and server computer systems represented by server 115 may form a local network, which may be programmed with processes described herein. In the Internet example, software components or services executing on computer system in the local network may communicate with computer programs on a cloud network 199 across the Internet. Communications with program on the Internet may include communication with programs residing on multiple different computer systems 110 or servers 132-135 across the network. The processes described above may be implemented for communication with programs implemented on one or more servers, for example. A server 135 on cloud 199, for example, may transmit messages through Internet 130, local network 120, and network interface 104 to a component on computer system 110. The software components and processes described above may be implemented on any computer system and send and/or receive information between networks as set forth above, for example.

By further example, server 131 may implement or otherwise have access to functionality implementing databases 151, application servers 153, web servers 154, and analytics tools 155. In an example, databases include inverted index data that can be used to respond to queries, or searches conducted by analytics tools 155. Also, updates to database 157 can be provided, and results 159 can be outputted.

FIG. 2 depicts a general idea of a 1:n Index 225. A set of values 210 includes a set of German cities, including Berlin 211, Bern 212, and Mainz 213, by example. The set of values 210 can be called a dictionary, in the sense that it includes terms that appear in the inverted index.

Each value can be associated with a valueID (collectively identified as 214) that can be a unique reference to its value. The inverted index can be implemented using a position vector 215, which includes an entry for each value in the set of values 210, and in which entries 216 and 217 are identified. Each entry in position vector 215 maps to a location in a data area 220 where data for the value associated with that position vector starts. Stated differently, each position vector identifies a beginning of a data set that can be interpreted to identify each position in a file where a given value appears. For example, location 221 is a start of position information for the value associated with position vector entry 216, and similarly, location 222 is a start of position information for the value associated with position vector entry 217. The position vector can be indexed by valueID. The first value (valueId) does not need a position vector entry, in that it can be assumed that this entry starts at the beginning of the data area. However, where there is a pointer to the beginning of the data area, this also can serve as a pointer to the start of the first valueID position information.

In the case of a table, or a relational database, row identifiers may be the positional information stored for each value (valueID). In that case, inside the data area, the rowIds where this valueId is used are stored. For storing those rowIds, compression can be used. Local Golomb coding is currently practiced. For this, a count of rowIds is stored for each valueID. This count is used to calculate an optimal Golomb parameter. Then, the rowIds are sorted into increasing size and the first rowId is stored. All the other rowIds are stored as differences from a prior rowId.

Some early approaches to inverted list compression focused on exploiting distributions of specific characteristics using Huffman coding or Golomb coding. Some more recent work has focused on trading higher compression ratio for decompression speeds. Higher compression ratios were originally attempted to be achieved by using the distribution of numbers to be coded via optimal compression rates. Still further approaches place greater emphasis on rapid decompression instead of optimal compression rates.

In one aspect, the disclosure provides an example embodiment of inverted list compression using variable byte-length encoding optimized for in-memory compression engine to perform one or more of encoding and decoding. Embodiments according to this disclosure provide in-memory encoding/decoding engine that is faster, and in many situations, while still using a smaller amount of storage than Golomb encoding. Large size and velocity measurements allow a comparison with Golomb encoding. Other features that can be provided according to the various examples disclosed below.

Instead of Golomb coding, another approach to compression of an inverted index is to use a variable number of bytes to encode each data element. For example, some data elements may be encoded in a single byte, while other data elements may require four bytes to be represented. In the context of an inverted index, in which positions within a database (such as row identifiers) are associated with keys, the row identifiers have varying lengths and thus may be represented by a commensurate number of bytes. Variable byte-length encoding is an alternative to Golomb encoding. Slightly worse compression ratios can be achieved as compared with Golomb coding. However, variable byte-length encoding can have faster access speeds than Golomb-encoded data.

FIG. 3 depicts an approach to variable byte-length encoding where during decoding, a machine may consider a bit of each byte to decide whether the next byte is a part of the same value or whether the read of that value is completed.

Figure 9:
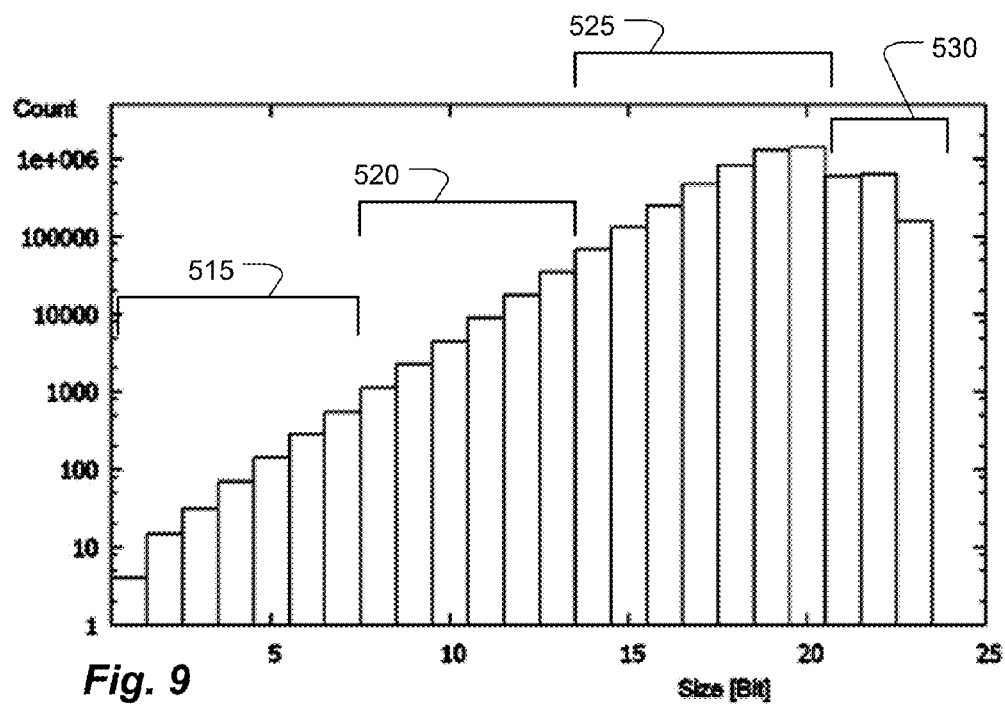
FIG. 9 depicts a histogram where different data elements are represented by different block sizes.

In particular, FIG. 3 depicts a variable byte-length encoding, where raw data 255, which comprises data elements 256-258, is to be stored as encoded data 280. Each data element 256-258 can be subdivided into one or more bytes. For example, data element 256 can be subdivided into bytes A and B (note: in this example, each of A and B is actually 7 bits, not a full byte). Each 7 bits is preceded by a flag bit that indicates whether the subsequent 7 bits is the end of a given value. For example flag 281 is a 1, indicating that the immediately subsequent 7 bits ($b_1$) is not the end of a value. Flag 282 is a binary 0, indicating that the immediately subsequent 7 bits (b2) is the end of a value (that started with ($b_1$)). By contrast, flag 283 is binary 0, indicating that the value represented by C can be fully represented in the 7 bits available from $b_3$. FIG. 9 shows values that are encoded with 7 bits (515), with 14 bits (520), with 21 bits (525), and with 28 bits (530).

Figure 4:
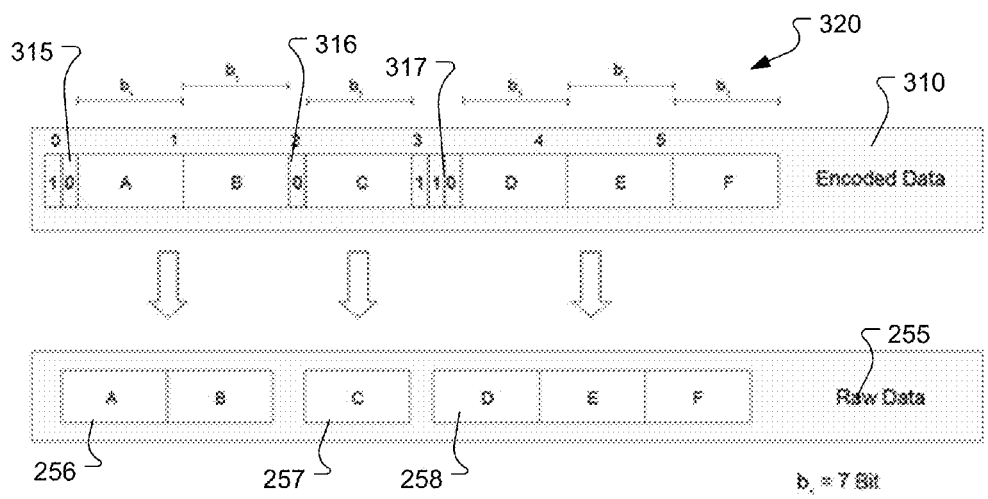
FIG. 4 depicts an example in which raw data is compressed to result in encoded data.

Better compression using variable numbers of bytes may be achieved by placing size information in front of a sequence of bytes representing a value. The size information can be provided using a unary code. FIG. 4 depicts an example in which raw data 255 is compressed to result in encoded data 310. Unary size information 315, 316, and 317 provide examples of unary codes that indicate respectively that 2 bytes, 1 byte, and 3 bytes are used to represent values 256, 257 and 258 from raw data 255. Using the size information, an appropriate number of bytes can be directly accessed and read together.

Fixed-Length Block Coding

Variable Byte-length encoding has a fixed incremental payload size of usually 7 or 15 bits, thus resulting in total blocks of 1 or 2 bytes. This facilitates a light compression without prior knowledge of the data to be compressed. However, if all the data to be compressed is available before the compression begins, it is possible to iteratively analyze the data. In such an iteration, an optimal block size for the data can be determined. For example instead of 7 bits payload per 1 bit size information one can use 11 bit payload per 1 bit size information. In this example each number with 11 or fewer bits can be represented with one block. Numbers with up to 22 bit are coded with 2 blocks. Such a procedure has been called escaping. Compared with Golomb Coding, this procedure requires more storage, but allows higher access speeds.

In sum, for fixed block length coding, each value is stored encoded with a multiple of an optimal fixed-block length/size. The case with a fixed block size of 7 bit is equal to the variable-byte-length encoding.

Variable-Block Length Coding

Figure 5:
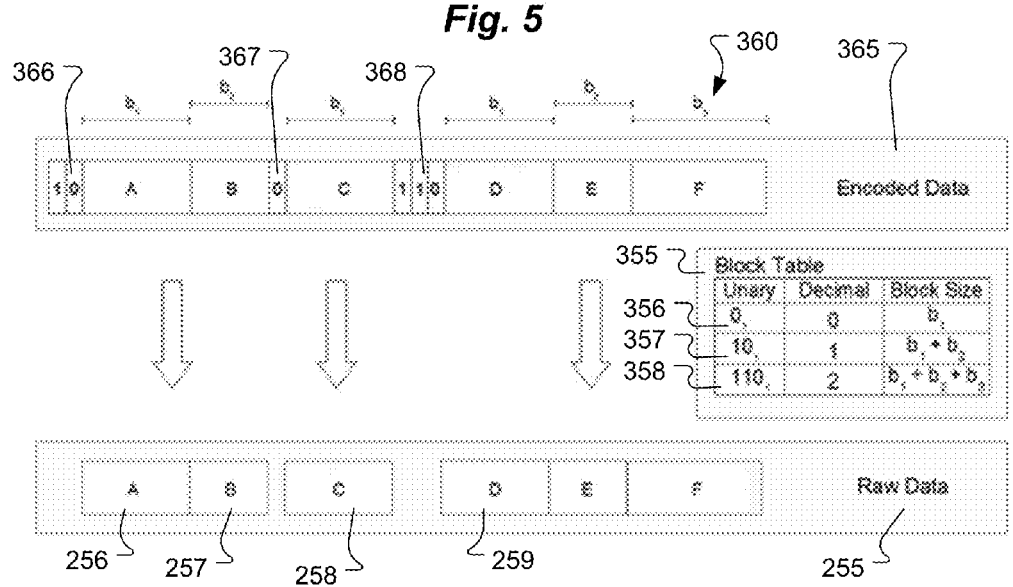
FIG. 5 depicts an example of variable block length coding with variable block sizes.

Instead of using varying numbers of a fixed-block length for encoding, variable block length coding with variable block sizes can be used. In this embodiment, as illustrated in FIG. 5, all the first blocks have a width b1, which, however can be different from all the second blocks with a width of b2 and so on (block sizes collectively identified as 360). A so called block table allows a direct mapping between the unary size information and the block size. A complex addition of all block sizes is not necessary.

Since the Unary-value acts as an index in the block table, the maximum size of the Unary-value is equal to the size of the block table. Limiting the size of the block table and thus the Unary-value makes two improvements. One improvement is that the highest entry in the block table can be stored without a trailing unary-coded 0. A second advantage is that an implementation of the decoding can achieve significant speed advantages due to the limited block table size. In addition to higher cache locality, it is possible to avoid conditional jumps. Eight entries in the block table has been found to provide an acceptable palette of block sizes. Therefore, a maximum Unary prefix with 7 bits provides good results.

Variable Length Block Coding with Graded Number Information

For values that need just 1 block, an additional bit in the Unary prefix coding of the block is used. Values that need to use more blocks also need more bits in the Unary encoding. Here, a further optimization may be achieved with an approach that is quite similar to Huffman coding. The block size that is used by most of the values can be represented by a unary 0. Block numbers that are used less frequently may be associated with greater unary values. Since only unary values are used, this encoding does not correspond to the Huffman coding. The typical slowdown of Huffman coding, due to its dictionary lookup, can be avoided. In fact, it can be shown that, in many cases, Huffman coding results in unary prefixes, due to the distribution of the values being compressed.

Mixing up two values in the block table does not cause loss of speed. In exceptional cases, the optimized order corresponds to the already established order.

Figure 6:
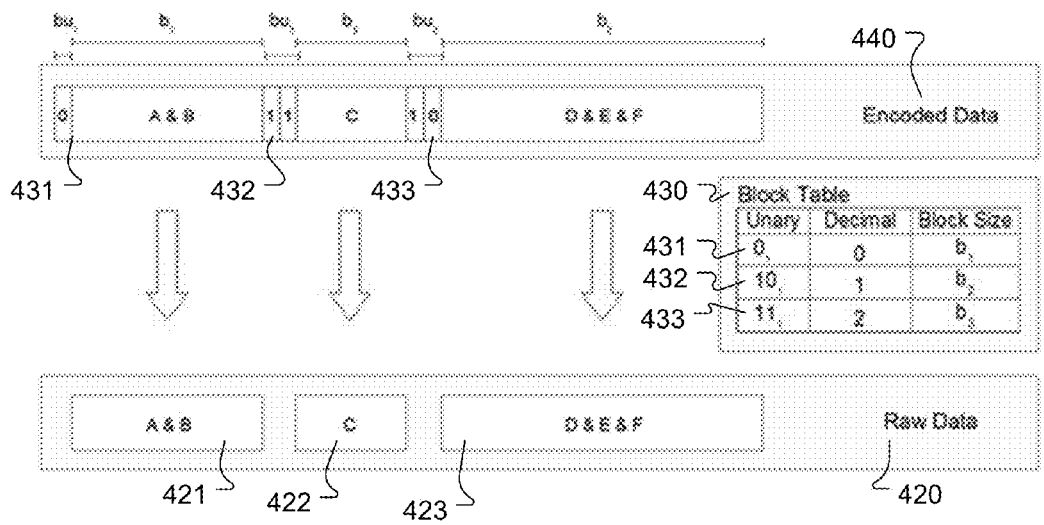
FIG. 6 illustrates an example of variable length block coding of raw data into encoded data, with optimized unary size information.

FIG. 6 illustrates an example of the variable length block coding of raw data 420 into encoded data 440, with optimized unary size information. The unary value 0 (431) requires $bu_1=1$ bit and is assigned to block size $b_1$ (see table 430) (ray data 421), which is the block sized used most often. Other unary block size indicators depicted in FIG. 6 include unary 10 (432) and 11 (433), which are used with raw data element 422 and 423, respectively.

There are two areas where the unary value can be saved: (1) In the previously discussed method, the size information is stored in the data area in front of the respective blocks; (2) the encoded data is divided into two areas.

Figure 7:
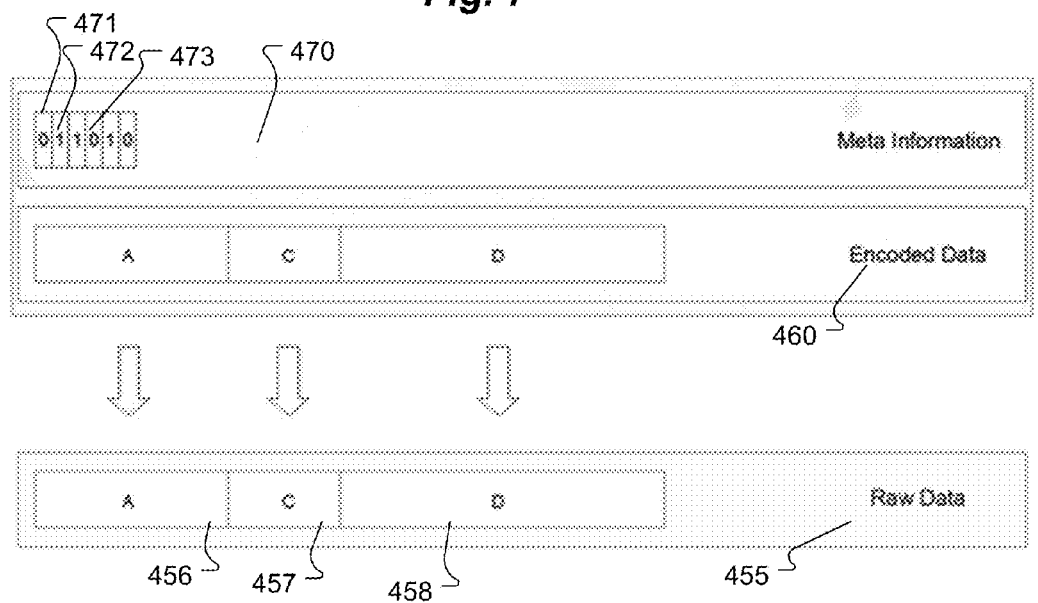
FIG. 7 shows an example implementation where unary size information is stored in a separate area from the encoded data.

FIG. 7 shows an example implementation where unary size information is stored in a separate area from the encoded data itself. In particular, FIG. 7 depicts that unary values 470 include unary values 471-473, which are used in parsing the encoded data 460 during reading. To produce encoded data from raw data 455, which comprises data elements 456-458, a block size is selected that is large enough to store each value (but, optimally, the block size would not be larger than a minimum required to store such value). Other techniques disclosed herein can be practiced (e.g., this separate meta data technique also can be practiced with the technique disclosed below, in which one or more pairs of block sizes that differ by only 1 bit are used for encoding data values). The approach of FIG. 7 allows a significantly faster reading of values. However, due to the variable block width there is not a defined and fixed relationship between positions in data 470 and in encoded data 460.

For two block sizes, $b_1$ and $b_2$, where $b_1=b_2-1$, any value that requires exactly $b_2$ bits is encoded with the corresponding block size $b_2$. Any value that requires fewer bits is encoded with b1, or a smaller block size, if available. Any value that requires more than $b_2$ bit uses a larger block size. For example, a value represented by $b_2$ bits in the raw data set can be represented by $b_1$ bits in the compressed data set, with an indication of a block size of $b_2$. In an implementation, the most-significant bit in values that are represented by $b_2$ bits must have a value of 1, or else that value would be representable by $b_1$ bits. As such, $b_2$ bits need not be explicitly stored, rather, the value of the most significant bit can be inferred. This method can be used with or without sorted size information. The omission of this bit (e.g., the most-significant bit) can allow further compression.

Figure 8:
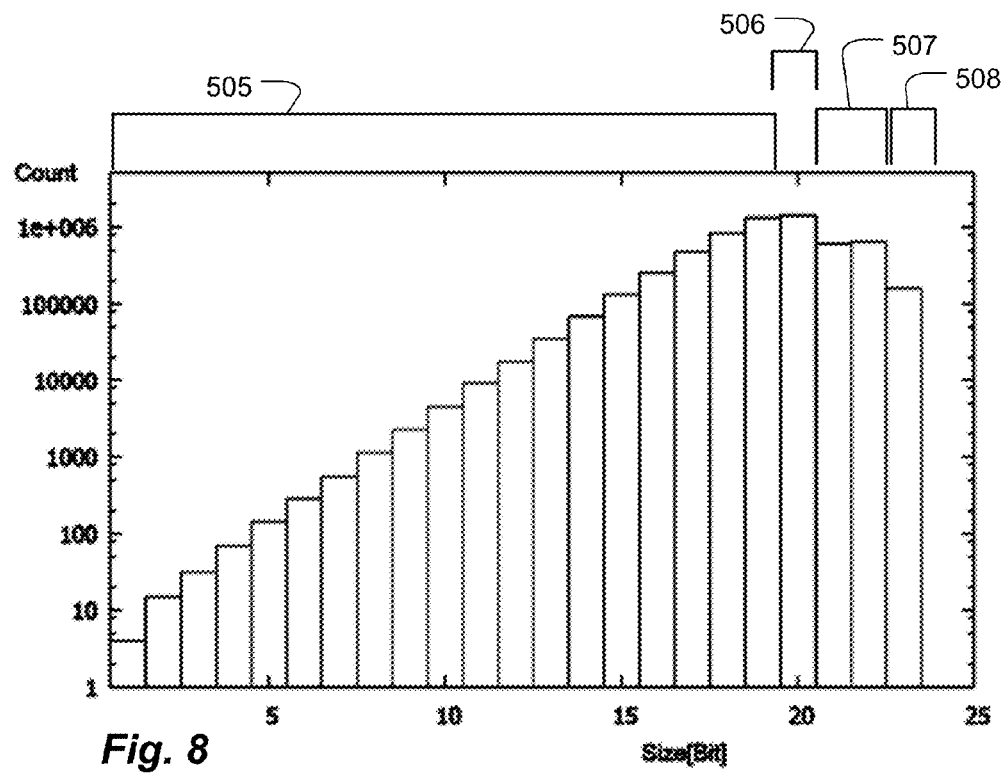
FIG. 8 depicts an example of unary encoding of block sizes.

In some implementations, each value is stored with an optimal block size. In FIG. 8, the block sizes 19 bit 505 (can be assigned Unary Prefix: $0_1$), 20-bit 506 (can be assigned Unary prefix: $10_1$), 22-bit 507 (assigned Unary prefix: $110_1$) and 23 bit 508 (assigned Unary prefix $1110_1$) are used. The Unary prefix assignments here reduce a number of bits required to represent the unary prefixes, in total, based on this example distribution of data lengths.

In more detail, variable-length block coding can further be practiced using sorting so that more frequently appearing block sizes are assigned smaller unary prefixes. By particular example, the mapping of the unary value to the block size can be implemented by a Huffman-like coding, where more frequent used block sizes are represented with shorter unary prefixes: 19 bit block-size with Unary prefix $0_1$, 20 bit block-size with Unary prefix $110_1$, 22 bit block-size with Unary prefix $10_1$ and 23 bits with Unary prefix $111_1$ (the lagging 0 can be dropped in actual usage). For variable block length coding, with and without sorting, and using the block sizes described above (as an example), the most significant bit of the blocks with 20 bit and 23 bit block sizes need not be stored. For example, 20-bit values will be stored as unary prefix $10_1$ and 19-bits of encoded data. Of course, these block sizes are simply an example, and other data sets would have block sizes tailored to their characteristics.

Compared to the Golomb-coded index, none of the disclosed approaches require count information concerning a number of rowIDs associated with each value ID. For the Golomb-coded index, this information is needed to calculate a parameter for a good compression.

Example Approaches to Calculating a Set of Block Sizes

The calculation of a set of block sizes (targeting optimality) can be made during a delta merge operation in a database (e.g., during database updating). In a general case, without limiting the number of different block sizes to eight, a maximum block size is assumed to be n bits. Then, all $2^n$ combinations of block sizes are considered as a possible optimal set. For each combination, the total size of the compressed data is to be determined, and then compared to identify an optimal set. In the case of the sorted size information, each combination must also be sorted. It is not sufficient to only sort the best determined combination, as it typically would not a globally optimal distribution (sorting would not be commutative such that results would differ if sorting is performed before or after the combinatorial evaluation. These operations can consume a great deal of processing resources. The restriction to require a set of eight block sizes reduces the number of possible combinations that have to be evaluated. As the largest block size is determined by n, there are still 7 selectable block sizes. Requiring eight different block sizes is exemplary; other implementations may target different numbers of block sizes, such as 2, 3, 4, 12, 16, and so on).

Heuristic approaches can be used to determine the set of block sizes to use. These example heuristics have worked for the cases evaluated, but there is no guaranteed maximum bounding on the error with the results returned by the heuristic. If there is no sorting, it is possible to construct cases in which the optimal solution is not found.

Based on these data, the first potential block size, starting at 1 for each potential block-size b two areas are considered. The number of values that would be encoded with this block size is called a l (lower case L). The amount of these values is referred to as L. The number of values above this block size is called r. The amount of these values is called R.

If b is not used as the block size, the values of L will be coded with a blocksize of $b' \geq b+1$. The encoding with the block size b' therefore requires at least 1 bit more per value, and thus a total of at least 1 (lower case L) bits more, compared with encoding with block size b. Thus, at least 1 bit is saved if b is used as the block size. If b is used as a block size, the remaining R values need one bit more for the Unary coding of the block size. Thus, r bits are lost, if b is the block size.

It follows that where b is used as block size, and if l>r, this solution does not provide optimality, l is a lower estimate of the savings. In the case of a distribution with a total of 74,707 to be encoded values and a previously calculated block size bb=1 with lb=400,324 (green) and rb=34 383 (red+blue) results for the potential block size b8=8 corresponding 18=18 132 (red), and r8=16 251 (blue). Thus, 18=18 132>16 251=r8 and b8 is set as the second block size. The above serves as a specific example of how a particular data set can be analyzed, and those of skill in the art would comprehend how to apply these general and specific examples, and related disclosures, to other datasets.

Optimized procedure for calculating the block sizes for a number of unsorted information and limited number of block sizes. The approach described in the previous section does not include any limitation on eight block sizes. An extension of the approach allows a faster determination of the eight optimal block sizes.

In the first step, the previously proposed method is used to determine if the (probably) optimal distribution requires more than eight block sizes. If this is not the case, the process can be stopped.

If a distribution with more than eight block sizes is determined in this way, a method that includes a recursive algorithm may be used. This algorithm generates a small amount of candidates, among which is the optimal set of block sizes. For this, for each block size b for which l>r, two execution paths are generated. The first execution path considers the distribution if the block size b is used. The second execution path sees the further distribution without using the block size b. Here, the first execution path is used if there are not eight block sizes formed. The best of the so-determined distributions corresponds to the (probably) optimal distribution.

Figure 10:
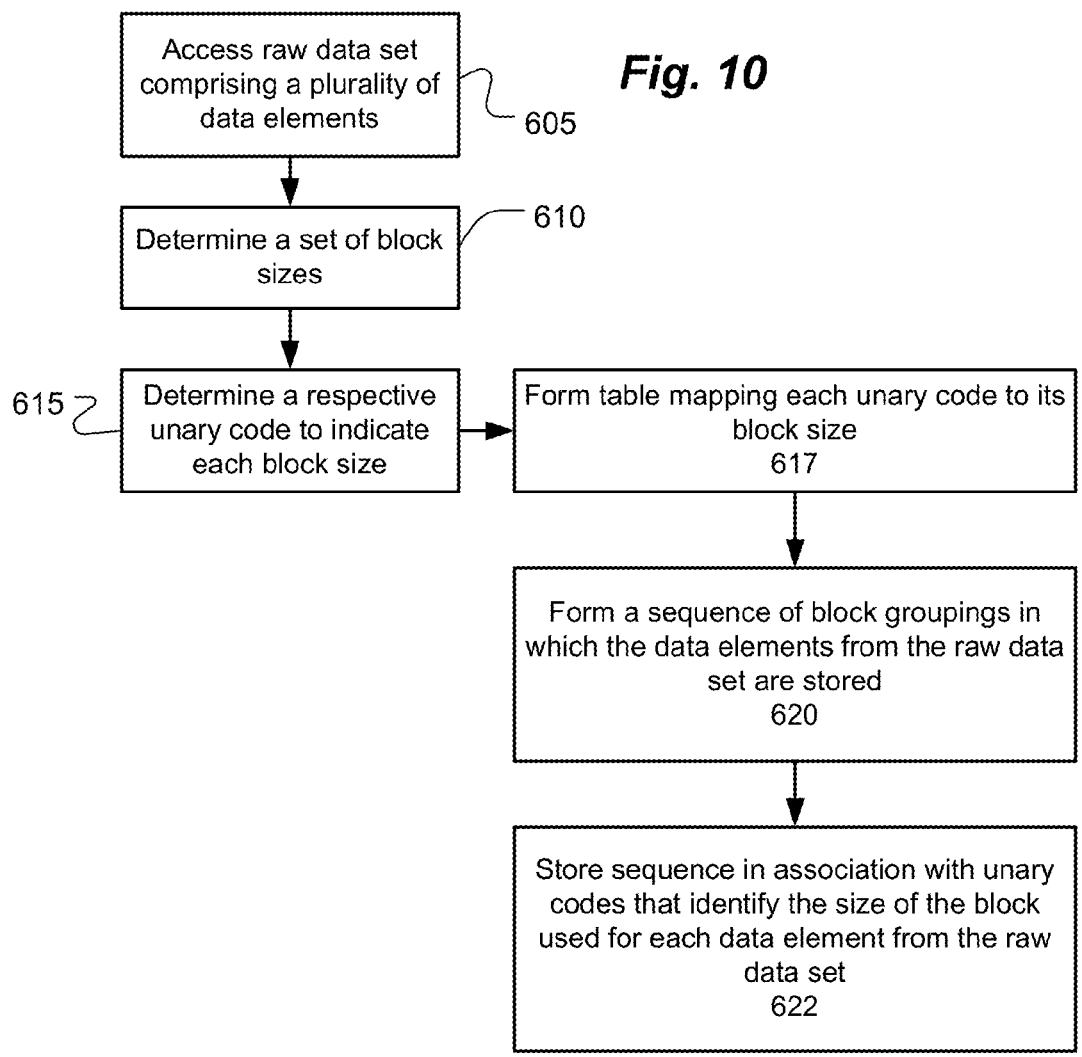
FIG. 10 depicts a process for a variable block size encoding approach.

FIG. 10 depicts a process for a variable block size encoding approach. The process includes, at 605, accessing a raw data set, and at 610 determining a set of block sizes. At 615, a determination of respective unary codes for the block sizes is completed. This determination can be performed using frequency information for a number of raw data elements that will be encoded for each block size, such that more frequent block sizes get smaller codes. At 617, a table that maps each unary code to its block size is made. FIGS. 5 and 6 provided different examples of tables, where a block size can be represented in terms of other block sizes, or a block size can be represented directly.

At 620, a sequence of block groupings is formed. Each block grouping comprises one or more blocks. Collectively, the one or more blocks of each grouping store a data element from the raw data set. In one example, there is a single block in the grouping, and in other examples, multiple blocks may be concatenated in order to store bits representing the data element. The histogram of FIG. 9 depicts a situation where different data elements are represented by different block sizes. Where a given block is bigger than required (e.g., where there is no combination of available block sizes that exactly provides the required number of bits, or a single block that exactly provides such required number of bits), padding bits can be used. At 622, the sequence of block groupings are stored in association with unary codes indicating the size of the block groupings. In one implementation, the unary codes can separate parts of the data area pertaining to different values (e.g, FIGS. 5 and 6), and in another implementation, a separate area can be devoted for unary codes (e.g., FIG. 7).

Figure 11:
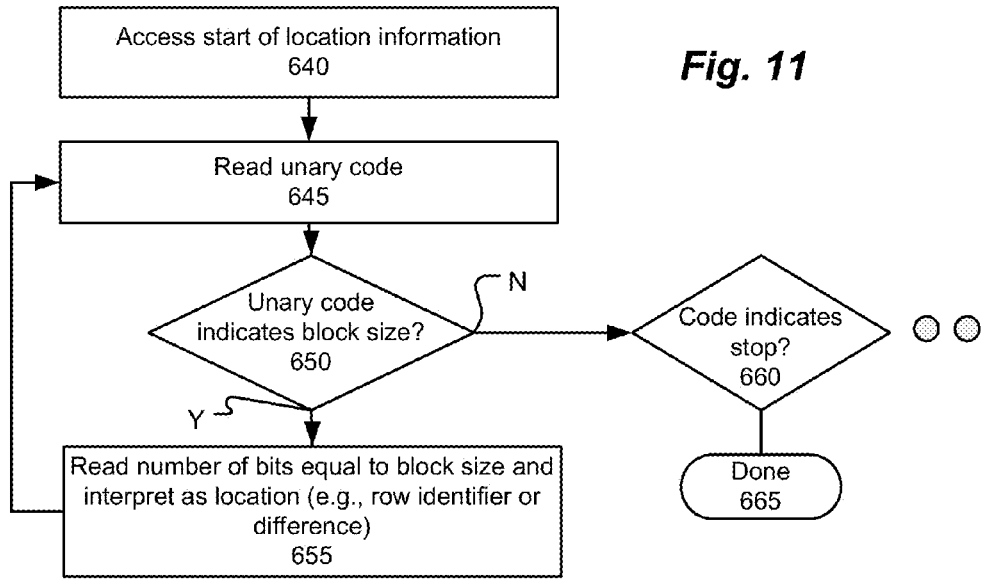
FIG. 11 depicts an example process of reading encoded data.

FIG. 11 depicts an example process of reading data encoded according to an implementation of the invention. At 640 and 645, a start of location information for a given valueID (e.g., 366 in FIG. 5) is accessed and a unary code is read. Where the unary code is stored with the location data, the unary code is read during the access 640. If there is a separate area for unary code storage, then a separate access may be implemented for that data. In implementations, such accesses do not need to be limited to only the data identified, but rather larger portions of data may be read and the relevant data can be examined or otherwise used. In an example, at 650, a decision can be made as to whether the next unary code indicates a block size to be read. If so, a number of bits commensurate to the block size is accessed from a data area and interpreted as row identifier data (or as a portion of a row identifier). Depending on an implementation such row identifier information may be difference information, or may be a portion of information sufficient to constitute a row identifier. Of course, this example is in the context of an inverted index for a table or other database. For other applications, the data read may be interpreted according to that application. If the unary code does not indicate a block size, then, at 660, the code can be checked for a stop indication. This decision process can be extended as desired to other possible codes that may be desired to be used.

Some implementations may not use any code other than a block size code. For example, leading bits to be next considered for the presence of a unary code can be analyzed, and if a valid code is not found, then the sequence of locations can be considered complete. As such, decision 650 is not necessary.

Size Comparison of Different Methods

The choice of compression method has a profound effect on the achieved compression ratio. One metric of interest is the size of the whole data area of the index. The following tables present some results in the column "rate" as a ratio of the Golomb based index and the disclosed approaches.

Based on these tests, variable block length coding approaches outlined herein can be a better solution than Golomb coding in many cases, and in some cases significantly better. Small columns can reach, due to the distribution of values within the column, compression rates of up to around 43% better than Golomb encoding. For larger columns, the optimized variable block length encoding is quite similar or better.

In one aspect, a model calculated from the raw data set to be compressed is used to arrive at a set of block sizes that provides an optimal distribution of block sizes for the data elements presented in the raw data set. Golomb coding provides the best results for a geometric distribution of the input values can be reached. However, many data sets do not have properties of a geometric distribution, and in some cases, data sets may have nearly random qualities. In such cases, and especially in cases where the distribution is nearly total random, better results are achieved by implementations of the disclosure than by Golomb coding.

Embodiments of the disclosure extent to using variable block length coding, and optimized variable block-length coding approaches to raw data sets outside of inverted indexes, and in fact can be used for compression of image and movie data.

In many cases, limiting the available block sizes to eight does not pose any significant degradation to the compression rate. However, in some cases, there is some degradation, although it is generally small. By limitation to eight block sizes affects the compression ratio relatively slightly. Thus, the column Store_Num needed with eleven blocks 103 516 331 bytes, so is only 0.032% smaller.

The prefixes are unary in all the described methods (for the highest unary value, the leading 0 can be dropped as described above). Table 5.3 shows a comparison with other coding conditions for the prefix. As the number of values with the block size decreases, the Unary coding corresponds to that of the Huffman coding, in that the coding of the block sizes corresponding to the frequency of use of the block size. A binary coding is appropriate for data sets in which all block sizes are used at the same frequency. Since that condition does not hold here, binary coding does not provide good results.

In this comparison, different encodings for the prefix for given block sizes are considered. It remains to be considered whether an alternative process of encoding the prefix has influence on the choice of the optimal block sizes. This is likely to dramatically increase the effort to calculate the optimal block size.

TABLE 5.2

Comparison of different compression methods, in bytes. Here, the column rate compares
a disclosed variable block-length encoding implementation to Golomb coding.

| Column | Bit length Compression Golomb-Coding | Byte lengths Encoding [Blocksize] Fixed Block Len | Variable Block length Variable block length sorted | opt. variable block length opt. variable block len | Rate |
|---|---|---|---|---|---|
| L_Orderk. | 17.253.439 | 18.666.791 | 16.279.762 | 15.930.271 | 91.6% |
|  | 17.383.812 | [11] 18.214.930 | 16.192.696 | 15.925.469 |  |
| L_Quant. | 11.252.278 | 6.464.041 | 5.792.117 | 5.438.966 | 102.1% |
|  | 5.328.068 | [7] 6.464.041 | 5.725.628 | 5.438.966 |  |
| L_Comm. | 16.503.341 | 11.130.509 | 9.250.127 | 8.939.842 | 96.4% |
|  | 9.270.532 | [12] 10.224.230 | 9.145.997 | 8.905.908 |  |
| Store_N. | 200.768.256 | 123.946.649 | 105.811.960 | 103.483.264 | 101.0% |
|  | 102.445.140 | [13] 112.464.273 | 105.795.641 | 100.777.704 |  |
| Year_W. | 17.795 | 12.512 | 5.903 | 5.769 | 58.4% |
|  | 9.876 | [2] 5.525 | 5.843 | 4.527 |  |
| Ship_To. | 161.665 | 178.745 | 144.823 | 140.875 | 80.0% |
|  | 175.928 | [8] 158.286 | 136.777 | 135.659 |  |
| Merlin_C. | 158.752 | 98.683 | 64.644 | 63.737 | 70.3% |
|  | 90.644 | [4] 78.666 | 63.490 | 62.863 |  |
| Sun_W. | 19.164 | 12.835 | 7.728 | 7.572 | 43.0% |
|  | 17.612 | [4] 10.368 | 7.557 | 7.331 |  |
| Total | 246.134.690 | 160.510.765 | 137.357.064 | 134.010.296 | 99.5% |
|  | 134.721.612 | 147.621.319 | 137.073.629 | 131.258.427 |  |

TABLE 5.3

Comparison of different codes for the prefix and the block size in bits.

| Column | Block size | Number values | relative freq. | Huffman-C. Total size | Unary Code Total size | Binary Code Total size |
|---|---|---|---|---|---|---|
| L_Ord. | 19 | 3.166.865 | 52.77% | 0 | 01 | 002 |
|  |  |  |  | 3.166.865 | 3.166.865 | 6.333.730 |
|  | 20 | 1.425.151 | 23.75% | 10 | 101 | 012 |
|  |  |  |  | 2.850.302 | 2.850.302 | 2.850.302 |
|  | 22 | 1.250.446 | 20.84% | 110 | 1101 | 102 |
|  |  |  |  | 3.751.338 | 3.751.338 | 2.500.892 |
|  | 23 | 158.753 | 2.65% | 111 | 11101 | 112 |
|  |  |  |  | 476.259 | 635.012 | 317.506 |
| Total: |  | 6.001.215 | 100.00% | 10.244.764 | 10.403.517 | 12.002.430 |
| Store. | 12 | 43.131.797 | 69.82% | 0 | 01 | 0002 |
|  |  |  |  | 43.131.797 | 43.131.797 | 129.395.391 |
|  | 13 | 16.152.600 | 26.15% | 10 | 101 | 0012 |
|  |  |  |  | 32.305.200 | 32.305.200 | 48.457.800 |
|  | 14 | 2.037.512 | 3.30% | 110 | 1101 | 0102 |
|  |  |  |  | 6.112.536 | 6.112.536 | 6.112.536 |
|  | 15 | 362.741 | 0.59% | 1110 | 1111 | 0112 |
|  |  |  |  | 1.450.964 | 1.450.964 | 1.088.223 |
|  | 16 | 66.769 | 0.11% | 11110 | 111101 | 1002 |
|  |  |  |  | 333.845 | 333.845 | 200.307 |
|  | 17 | 16.197 | 0.03% | 111110 | 1111101 | 1012 |
|  |  |  |  | 97.182 | 97.182 | 48.591 |
|  | 18 | 4.377 | <0.01% | 1111110 | 11111101 | 1102 |
|  |  |  |  | 30.639 | 30.639 | 13.131 |
|  | 26 | 2.855 | <0.01% | 1111111 | 111111101 | 1112 |
|  |  |  |  | 19.985 | 22.840 | 8.565 |
| Total |  | 61.774.848 | 100.00% | 83.482.148 | 83.485.003 | 185.324.544 |

Speed Measurements

Speed comparisons between the Golomb coding and the (optimized) variable-length coding block are difficult. The measurements are made on a computer with four Intel Xeon 7560 processors, each with eight logical cores and 256 GB main memory. The operating system is SUSE Linux Enterprise Server 11 is used. All measurements are repeated several times to compensate for any fluctuations.

Table 5.4 shows the access speeds in different columns A distinction is made between different filter examples. Different filters directly affect the number of rows read in the index. For a small number of read lineIds there is no difference between the measured values. For a larger number of lines, the measurements show that the access speed with the (optimized) variable length coding block is roughly 10% faster. Differences between variable-length block coding and optimized variable block length encoding are within the measurement uncertainty.

TABLE 5.4

Speed comparisons between encoding and Golomb (optimized) variable-length encoding in μS.

| Column | Filter | Number Results | Golomb-Coding | variable Block len | opt. vari. Block Len | Factor |
|---|---|---|---|---|---|---|
| L_Orderkey | =1 | 6 | 9 | 9 | 9 | |
| | <10 | 25 | 11 | 11 | 11 | |
| | <100 | 105 | 19 | 19 | 19 | |
| | <1.000 | 1.004 | 11 | 10 | 10 | 92% |
| | <10.000 | 9.965 | 1.07 | 95 | 95 | 89% |
| Pa_Direct_Cd | ='000004' | 358 | 27 | 26 | 27 | |
| | <'000104' | 2.803 | 18 | 15 | 15 | 86% |
| | <'000904' | 64.554 | 4.06 | 3.42 | 3.41 | 84% |
| Unit_Price | =0 | 260 | 22 | 23 | 23 | |
| | <500 | 3.703 | 24 | 20 | 20 | 86% |
| Year_Week. | =1 | 115 | 13 | 14 | 15 | |
| | <10 | 1.795 | 10 | 96 | 96 | 94% |
| | <30 | 5.995 | 32 | 29 | 30 | 91% |
| | <50 | 10.195 | 55 | 50 | 50 | 90% |
| Store_Num | =1 | 20.2558 | 65 | 58 | 58 | 89% |
| | <15 | 9.424.376 | 261.114 | 238.88 | 239.015 | 92% |

Table 5.5 shows measured values for the some SQL statements. These measurements have much larger fluctuations than the results in Table 5.4. Nevertheless, also here the variable block length coding is faster by a factor of 20%.

Table 5.6 shows measurements in which the entire index is accessed sequentially. This is manually programmed and is not forced by an SQL statement. In these measurements, the variable block length coding scheme used was found to be superior to Golomb coding by around 15%.

TABLE 5.5

Speed comparisons between Golomb coding and optimized variable block-length encoding for some join operations in μS.

| | Golomb-Coding | opt. vari. Block len | Factor |
|---|---|---|---|
| Schnellstes | 10.051 | 8.683 | 81.6% |
| Durchschnitt | 16.526 | 12.855 | 77.8% |

TABLE 5.6

Speed comparisons between Golomb coding and variable block length encoding for a full runs of the iterator in micro seconds (μs).

| Column | Golomb-Coding | Var. Block Len. | Factor |
|---|---|---|---|
| L_Orderkey | 181.720 | 161.572 | 88.9% |
| L_Quantity | 88.781 | 71.548 | 80.6% |
| Pa_Direct_Cd | 3.015 | 2.361 | 78.3% |
| Unit_Price | 134 | 117 | 87.3% |
| Year_Week_Num | 350 | 311 | 88.9% |

A Nearly-1:1-Index

Between the two cases of 1:1- and a 1-to-many mapping there is a special case in which there is a nearly 1:1 mapping. In this case, almost all valueIds are assigned exactly to one Row Id, however, few individual Value Ids may be assigned to several Row Ids. Thus, it is a 1:n index, although the essential features of the 1:1 index are present.

As an example of a nearly-1:1-mapping within the TPC-H data is the column product name. This is almost 1:1, but three products have the same name. But also other columns, such as the sum of the outstanding items of a customer may be eligible for such distribution.

For a nearly 1:1 mapping/assignment, for each valueId it can be saved whether that valueId has a 1:1 or a 1:n mapping. This can be saved with one additional bit (green one in FIG. 6.9). For a 1:1 mapping, one can directly store the rowId in the position Vector. For a 1:n mapping, one can store a simple reference to the data area in the position vector. The actual rowIds are then stored in the data area. In the data area can be used any kind of compression like the Golomb coding or the optimized variable block length encoding.

Figure 12:
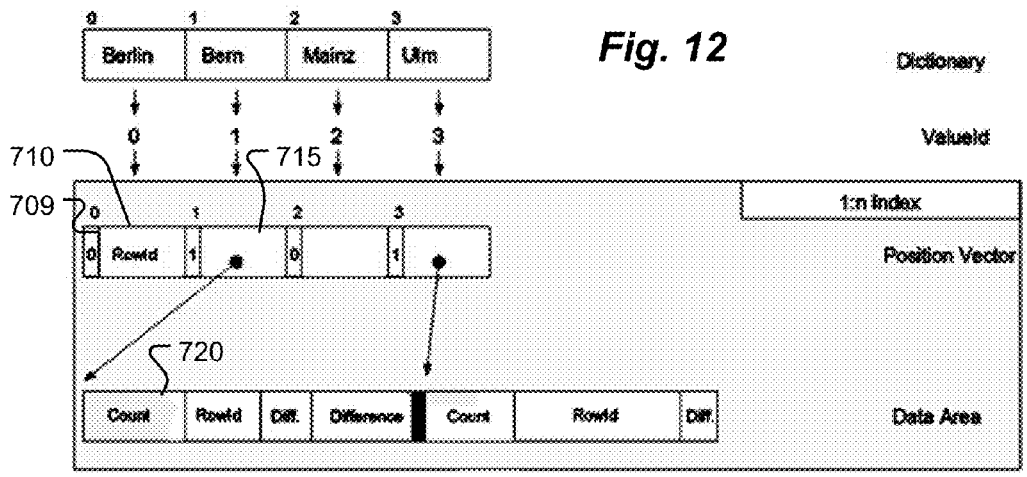
FIG. 12 depicts an example index for a data set that is indexed using a nearly-1:1 mapping approach.

FIG. 12 shows an example index for a data set that is indexed using a nearly-1:1 mapping approach. A bit 709 in position vector 715 indicates whether an associated portion 710 of position vector 715 directly identifies a location of a single (1:1 entry) for a particular value, or whether that portion 710 instead includes a pointer (or reference) to a data area that includes a list of locations (a 1:n mapping). For example, in the context of a database, position vector 715 can include a rowId in the position vector (1:1 mapping) or a pointer to a string of values that can be compressed according to this disclosure or by Golomb coding (1:n mapping). In the context of FIG. 12, pointer 715 serves as an example of a 1:n mapping, and Golomb encoding data 720 provides the location information for the valueID to which pointer 715 pertains.

Figure 14:
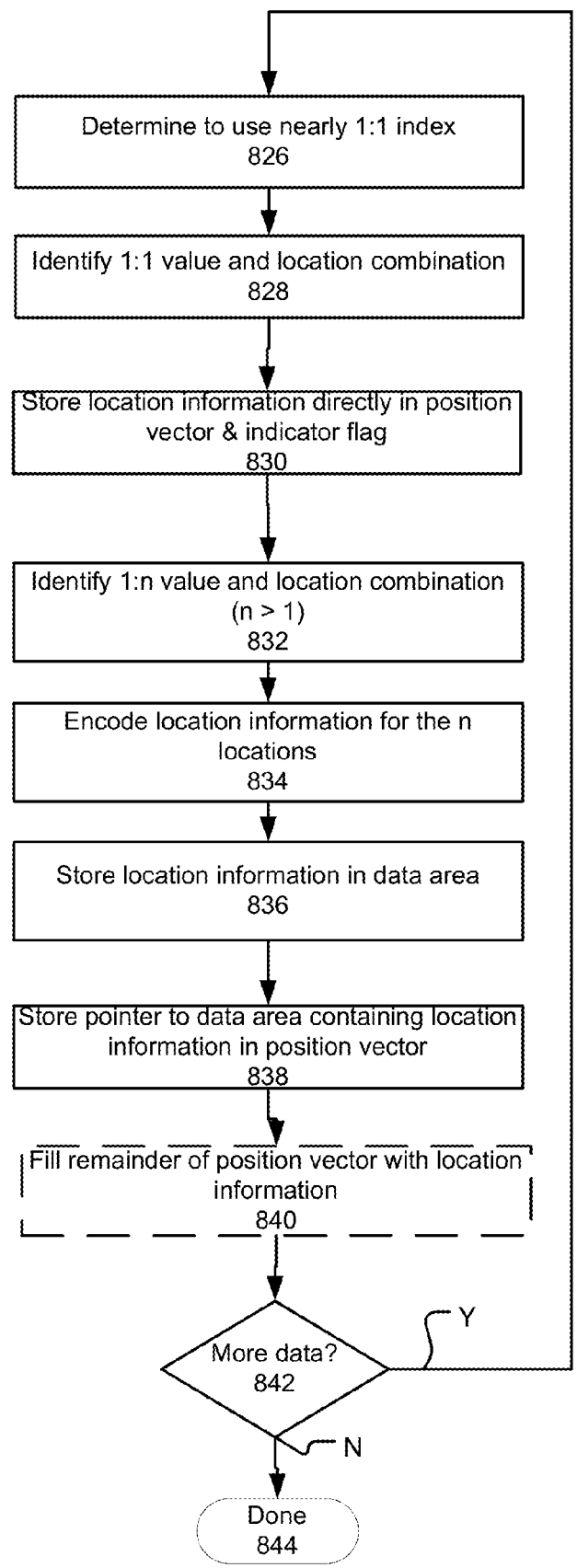
FIG. 14 depicts an example method for encoding data for a nearly 1:1 index.

FIG. 14 depicts an example method for encoding data for a nearly 1:1 index. At 826, a determination to use a nearly 1:1 index is made, and can be performed based on an analysis of a dataset to be encoded. At 828, a 1:1 value/location combination can be identified. For that 1:1 combination, at 830, location information can be stored directly in a position vector, and an indicator flag can be set appropriately. At 832, a 1:n value/locations combination is identified. For this combination, at 834, location information for the n locations are encoded, and at 836, such encoded data is stored in a data area. At 838, a pointer is stored in position vector to location in data area. At 840, a remainder of a fixed length field in the position vector storing this pointer can be filled with location information. At 842, a determination concerning whether more raw data remains to be processed is made, and if so the process continues to process the data. Otherwise, at 844, the process can be considered completed. The example portions of the process depicted can be performed in a different order than what is illustrated. In fact, depending on the raw data set being processed, 1:n or 1:1 values may occur in any order. Also, 840 may or may not be performed, or may be performed before 836, for example.

Figure 15:
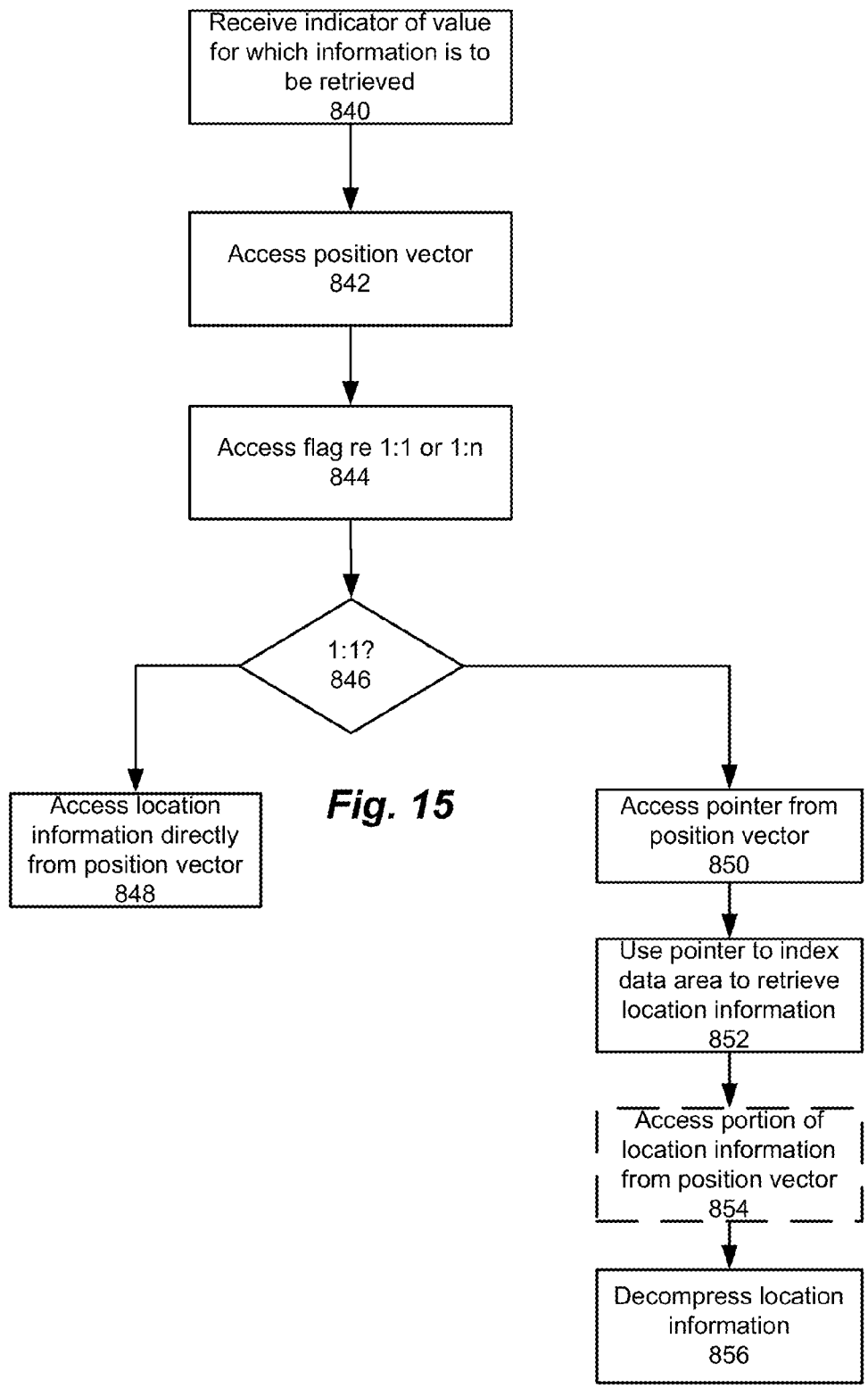
FIG. 15 depicts an example process of reading a set of location data for a given valueID that was encoded according to a nearly 1:1 index.

FIG. 15 depicts an example process of reading an set of location data for a given valueID that was encoded according to a nearly 1:1 index implementation. At 840, an indicator is received, the indicator identifies a value for which inverted index information is to be retrieved (e.g., valueID 1 of FIG. 2). At 842, a location in a position vector for that valueID is accessed. At 844, a flag indicative of whether that part of the position vector is encoded 1:1 or 1:n is accessed. At 846, a decision is made concerning whether the flag indicates 1:1 or 1:n. If 1:1, then at 848, the location information (e.g., a single rowID) is accessed directly from the position vector. If 1:n, then at 854, the position vector is accessed and interpreted as a pointer. At 852, a part of a data area identified by the pointer is indexed and location information there is retrieved. In one implementation, each pointer has a shorter length than a fixed length field of the position vector that stores the pointer. In such implementations, a pointer does not completely fill the fixed length field in the position vector allocated for it, and so some part of the location information can be stored there. If so, at 854, such location data is accessed. At 856, the complete location information is decompressed to produce the locations at which the valueID appears (e.g., rowIDs for rows that have a column that includes the value identified by the valueID).

By moving from the data area to the position vector the data area is much smaller. A smaller range of data leads to shorter position entries. However, the width of the fields in the position vector are not reduced accordingly. This is due to rowIds that are stored directly in the position vector. In addition, the width of the position vector by the extra bit for a decision on the 1:1 mapping increases. Unlike the previous approaches there is an entry point for the first value Id.

Figure 13:
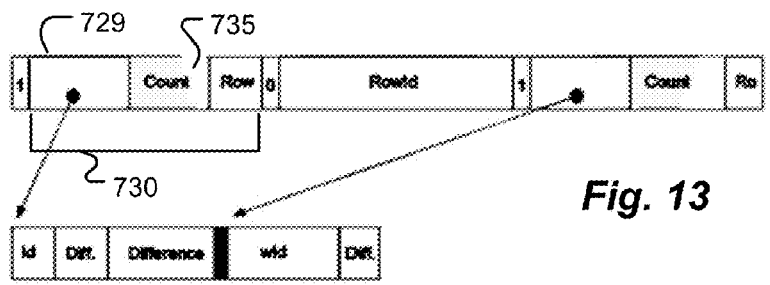
FIG. 13 depicts an example optimization of the nearly 1:1-index with direct storage of some information of the data area inside the position vector.

Further optimization of the nearly 1:1-index can be obtained by directly storing some information of the data area inside the position vector, an example of which is shown in FIG. 13. Assuming that the largest entry point requires 15 bits, but the biggest rowId requires 22 bits, then for every entry point, at least 7 bits will be unused. Thus, in the first 15 bits of the position vector the entry point can be saved. In the last 7 bits in the position vector and the data area the rowIds and their differences are stored. Access to the rowIds may need to combine the two parts in FIG. 6.13. The position vector can continue to use fixed widths. FIG. 13 shows an example where field 730 includes a pointer 729 for a 1:n mapping, and a remainder of field 730 is filled with a portion 735 of data for the 1:n mapping (here, the count and a beginning of a rowID for Golomb coding is shown, by example).

A method can detect whether there is a dataset appropriate to use a nearly 1:1 mapping implementation for an inverted index. One approach can be to compare a number of values and a number of rows. For 2*values>rows there are at least 2*values−rows mappings.

The decision whether to use the nearly-1:1-optimized index can be done by a calculation or estimation of both the expected index sizes. if the optimized variable block length coding is used inside the data area, then based on the distribution of the differences, detailed analysis about the size of the 1: n and the nearly-1:1-index can be made. The size also can be compared to a size for a Golomb coded data area. The smaller of 1:n and nearly 1:1 indices can be employed (using Golomb coding or codings according to this disclosure).

Measurements for Nearly-1:1-Index

Tables 6.5, 6.6 and 6.7 provide size measurements for nearly-1:1 mappings. It turns out that despite the extra bit values to distinguish between a 1:1- and a 1-to-many association (in FIGS. 6.9 and 6.10 are each shown in green) reaches for the 1:1 mapping compression rates of up to 69%. Table 6.5 compares the additional optimized approach in FIG. 6.9 with the more streamlined approach in FIG. 6.10. It turns out that the compression rate can be increased slightly. This does in most cases not justify the complex implementation and slowdowns when reading.

TABLE 6.5

Size comparison between a Golomb-coded 1:n-index and nearly 1:1 - in assignments optimized index of the column L_Comment bytes.

| Column | Field | Size |
|---|---|---|
| Normal | Position Vector (28 Bit) | 5.344.112 |
|  | Data | 18.130.252 |
|  | Total | 23.474.364 |
| Optimized | Position Vector (26 Bit) | 14.887.168 |
|  | Data | 4.932.680 |
|  | Bit Vector | 572.583 |
|  | Total | 20.392.431 |
| Compression Rate (Opt/Normal) |  | 86.9% |
| Further | Position Vector (26 Bit) | 14.887.168 |
| Optimized | Data | 4.432.680 |
|  | Bit Vector | 572.583 |
|  | Total | 19.892.431 |
| Compression Rate (Further Optimized |  | 84.7% |

TABLE 6.6

Size comparison between a Golomb-coded 1:n-index and nearly 1:1 - in assignments optimized index of the column P_Name bytes.

| Column | Field | Size |
|---|---|---|
| Normal | Position Vector (22 Bit) | 183.336 |
|  | Data | 509.484 |
|  | Total | 692.820 |
| Optimized | Position Vector (18 Bit) | 449.992 |
|  | Data | 24 |
|  | Bit Vector | 25.000 |
|  | Total | 475.016 |
| Compression Rate (Opt/Normal) |  | 69% |

TABLE 6.7

Size comparison between a Golomb-coded 1:n-index and nearly-1:1 - in assignments optimized index of the column P_Comment bytes.

| Column | Field | Size |
|---|---|---|
| Normal | Position Vector (22 Bit) | 181.160 |
|  | Data | 472.860 |
|  | Total | 654.020 |
| Optimized | Position Vector (21 Bit) | 345.856 |
|  | Data | 194.120 |
|  | Bit Vector | 16.469 |
|  | Total | 556.445 |
| Compression Rate (Opt/Normal) |  | 85% |

Table 6.8 shows the example of the column L_Comment a comparison with an index without block-position vector. Because of the number of values in relation to the total number of lines would be used according to equation 4.3 (p. 22) has a block size of 3 for the column L_Comment. Without that block formation of the position vector in Table 6.8 and complete accordingly larger. Speed comparison between the two approaches using the example of the column L_Comment are impressive. A significant gain in speed of almost 30% of access time for the simple-optimized nearly 1:1 index can be reached. It is thus clear that the optimized nearly 1:1 mapping index is significantly smaller and faster than previous approaches.

TABLE 6.8

Size comparison between a Golomb-coded 1:n-items excluding block-position vector and nearly-1:1-optimized index assignments for column L_Comment.

| Colunm | Field | Size |
|---|---|---|
| Normal | Position Vector (28 Bit) | 16.032.336 |
|  | Data | 18.130.252 |
|  | Total | 34.162.588 |
| Optimized | Position Vector (26 Bit) | 14.887.168 |
|  | Data | 4.932.680 |
|  | Bit Vector | 572.583 |
|  | Total | 20.392.431 |
| Compression Rate (Opt/Normal) |  | 59.7% |

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. A method of data compression, comprising:
   accessing, in a computer system, a raw data set comprising a plurality of data elements;
   determining, in the computer system, a set of block sizes to be used in forming an encoded data set providing a compressed representation of the plurality of data elements in the raw data set, wherein the set of block sizes comprises differing block sizes;
   determining, in the computer system, a respective grouping of one or more blocks in which to store each data element of the raw data set, each block in the grouping being of a block size selected from the set of block sizes; and
   storing, in a non-transitory machine readable medium, the groupings in a sequence, in association with respective unary size codes indicative of a size of each grouping in the sequence.

2. The method of data compression of claim 1, wherein the plurality of data elements of the raw data set comprise inverted index data, the inverted index data comprising a plurality of values and for each value, one or more locations in a dataset where that value appears.

3. The method of data compression of claim 1, further comprising causing the association between the groupings and their respective unary codes by storing the unary codes in the sequence, each preceding the grouping to which it pertains.

4. The method of data compression of claim 1, wherein each block comprises binary data,
   the determining the set of block sizes comprises determining at least one pair of block sizes of n bits and n+1 bits, respectively, and
   the storing comprises storing a data element of the raw data set having n+1 bits with a unary code indicating a block size of n+1 bits, with a data field of n bits by excluding the most significant bit of the raw data element having n+1 bits from storage in the block.

5. The method of data compression of claim 1, further comprising creating, in the computer system, a table mapping the unary size codes to sizes of their groupings.

6. The method of data compression of claim 5, wherein the table comprises an entry for each unary size code indicating an absolute bit length.

7. The method of data compression of claim 5, wherein the table comprises respective entries for unary size codes indicating a bit length relative to a bit length of a different unary size code in the table.

8. A non-transitory machine readable medium storing instructions that when executed by a computer processor configure the computer processor for:
   accessing a raw data set comprising a plurality of data elements;
   determining a set of block sizes to be used in forming an encoded data set providing a compressed representation of the plurality of data elements in the raw data set, wherein the set of block sizes comprises differing block sizes;
   determining a respective grouping of one or more blocks in which to store each data element of the raw data set, each block in the grouping being of a block size selected from the set of block sizes; and
   storing, in a non-transitory machine readable medium, the groupings in a sequence, in association with respective unary size codes indicative of a size of each grouping in the sequence.

9. The non-transitory machine readable medium of claim 8, wherein the plurality of data elements of the raw data set comprise inverted index data, the inverted index data comprising a plurality of values and for each value, one or more locations in a dataset where that value appears.

10. The non-transitory machine readable medium of claim 8, wherein the instructions further configure the computer processor for causing the association between the groupings and their respective unary codes by storing the unary codes in the sequence, each preceding the grouping to which it pertains.

11. The non-transitory machine readable medium of data compression of claim 8, wherein
   each block comprises binary data,
   the determining the set of block sizes comprises determining at least one pair of block sizes of n bits and n+1 bits, respectively, and
   the storing comprises storing a data element of the raw data set having n+1 bits with a unary code indicating a block size of n+1 bits, with a data field of n bits by excluding the most significant bit of the raw data element having n+1 bits from storage in the block.

12. The non-transitory machine readable medium of claim 8, wherein the instructions further configure the computer processor for creating a table mapping the unary size codes to sizes of their groupings.

13. The non-transitory machine readable medium of claim 12, wherein the table comprises an entry for each unary size code indicating an absolute bit length.

14. The non-transitory machine readable medium of claim 12, wherein the table comprises respective entries for unary size codes indicating a bit length relative to a bit length of a different unary size code in the table.

15. A system, comprising:
a processor; and
a non-transitory machine readable medium coupled with the processor, and storing machine readable data that when executed by the processor cause the processor to be configured to:
access a raw data set comprising a plurality of data elements,
determine a set of block sizes to be used in forming an encoded data set providing a compressed representation of the plurality of data elements in the raw data set, wherein the set of block sizes comprises differing block sizes,
determine a respective grouping of one or more blocks in which to store each data element of the raw data set, each block in the grouping being of a block size selected from the set of block sizes, and
store, in a non-transitory machine readable medium, the groupings in a sequence, in association with respective unary size codes indicative of a size of each grouping in the sequence.

16. The system of claim 15, wherein the plurality of data elements of the raw data set comprise inverted index data, the inverted index data comprising a plurality of values and for each value, one or more locations in a dataset where that value appears.

17. The system of claim 15, wherein the machine readable data further cause the processor to be configured to cause the association between the groupings and their respective unary codes by storing the unary codes in the sequence, each preceding the grouping to which it pertains.

18. The system of claim 15, wherein
each block comprises binary data,
the machine readable data that causes the processor to be configured to determine the set of block sizes comprises machine readable data that causes the processor to be configured to determine at least one pair of block sizes of n bits and n+1 bits, respectively, and
the machine readable data that causes the processor to be configured to store comprises machine readable data that causes the processor to be configured to store a data element of the raw data set having n+1 bits with a unary code indicating a block size of n+1 bits, with a data field of n bits by excluding the most significant bit of the raw data element having n+1 bits from storage in the block.

19. The system of claim 15, wherein the machine readable data further cause the processor to be configured to create a table mapping the unary size codes to sizes of their groupings.

20. The system of claim 19, wherein the table comprises an entry for each unary size code indicating an absolute bit length.

* * * * *